United States Patent [19]

Chu

[11] Patent Number: 5,047,622

[45] Date of Patent: Sep. 10, 1991

[54] LONG WAVELENGTH INFRARED DETECTOR WITH HETEROJUNCTION

[75] Inventor: Tak-Kin Chu, Bethesda, Md.

[73] Assignee: The United States of America as represented by the Secretary of the Navy, Washington, D.C.

[21] Appl. No.: 645,960

[22] Filed: Jan. 22, 1991

Related U.S. Application Data

[62] Division of Ser. No. 539,958, Jun. 18, 1990, Pat. No. 5,012,083.

[51] Int. Cl.$^5$ .............................................. H01J 40/14
[52] U.S. Cl. .................................. 250/211 J; 357/30
[58] Field of Search ............ 250/211 J, 211 R, 208.1, 250/338.4; 357/16, 30 E, 30 F

[56] References Cited

U.S. PATENT DOCUMENTS 4,698,494 10/1987 Kato et al. ........................ 250/208.1
4,861,976 8/1989 Jewell et al. ...................... 250/211 J

*Primary Examiner*—David C. Nelms
*Assistant Examiner*—K. Shami
*Attorney, Agent, or Firm*—Kenneth E. Walden; Jacob Shuster

[57] ABSTRACT

An infrared radiation detector having a first semiconductor layer deposited on a substrate to form a diode junction with an overlay contact, is rendered more effective to detect long wavelength radiation by deposit of a second semiconductor layer between the first layer and the overlay contact in a heterojunction arrangement. The semiconductor materials are selected so as to separate radiation absorbing and electrical functions respectively performed within the two layers and to produce an enhanced output across the diode junction between the first layer and the overlay contact.

10 Claims, 1 Drawing Sheet

LONG WAVELENGTH INFRARED DETECTOR WITH HETEROJUNCTION

BACKGROUND OF THE INVENTION

This invention relates generally to radiation detectors and in particular to infrared detectors of the photovoltaic diode type as disclosed in prior copending application Ser. No. 07/539,958, filed June 18, 1990 and now U.S. Pat. No. 5,012,083, with respect to which the present application is a division.

Photovoltaic diode detectors presently available usually have limited wavelength signal detection capabilities because of bandgap characteristics of its semiconductor material in a photon-counter mode of operation. Because of the narrow bandgap of the single semiconductor layer involved, diode junction resistance, which is mathematically related to bandgap magnitude, is correspondingly small when long wavelength radiation is being sensed. The signal voltage output of such photodiode is also small as a result of the relationship of the wavelength to the bandgap of the semiconductor material. The small bandgap involved also gives rise to a high noise level in the signal output even in the absence of illumination because of the background components of the radiation being absorbed causing generation of charge carriers (conduction band electrons and valence band holes) transported across the diode junction to create random noise in the process. One example of such a photodiode detector of a single semiconductor layer type is disclosed in U.S. Pat. No. 4,763,176 to Ito.

Heterojunction types of multi-layer photodiode detectors on the other hand are disclosed for example in U.S. Pat. Nos. 4,297,717, 4,686,550 and 4,763,176 to Li, Capasso et al. and Ito, respectively. However, none of the latter three patents are specifically concerned with enhancing signal outputs heretofore degraded when detection of relatively long wavelength infrared radiation is involved.

Accordingly, it is an important object of the present invention to provide an enhanced signal from a photodiode type of infrared radiation detector having a small bandgap semiconductor layer through which long wavelength radiation is absorbed.

An additional object in accordance with the foregoing object is to enable a greater flexibility in the design of photodiode detectors to meet different requirements with unexpectedly high signal output voltages and a reduced signal-to-noise ratio in response to detection of infrared radiation within a relatively long wavelength band.

SUMMARY OF THE INVENTION

In accordance with the present invention, the problems and operational wavelength limits associated with photodiode detectors of the aforementioned type, are circumvented by deposit on a first narrow bandgap layer having a radiation absorbing function, a second wider bandgap layer of semiconductor material limited in function to electrical signal enhancement with substantially no radiation absorption. The position of the conduction band edge of such second semiconductor layer is interrelated with that of the radiation absorbing layer on which it is deposited so as to substantially overcome any potential barrier to electron movement toward the diode rectifying junction formed with an overlay on the second semiconductor layer with increased junction resistance. The valence band edge of the second layer is furthermore lower than the valence band edge of the first narrow bandgap layer supported on the detector substrate to form a barrier against hole movement toward the junction while the thickness of the second layer is such as to both accommodate band bending development and avoid appreciable radiation absorption.

BRIEF DESCRIPTION OF THE DRAWING FIGURES

Other objects, advantages and novel features of the invention will become apparent from the following detailed description of the invention when considered in conjunction with the accompanying drawing wherein.

DETAILED DESCRIPTION OF THE PREFERRED EMBODIMENT

Figure 1:
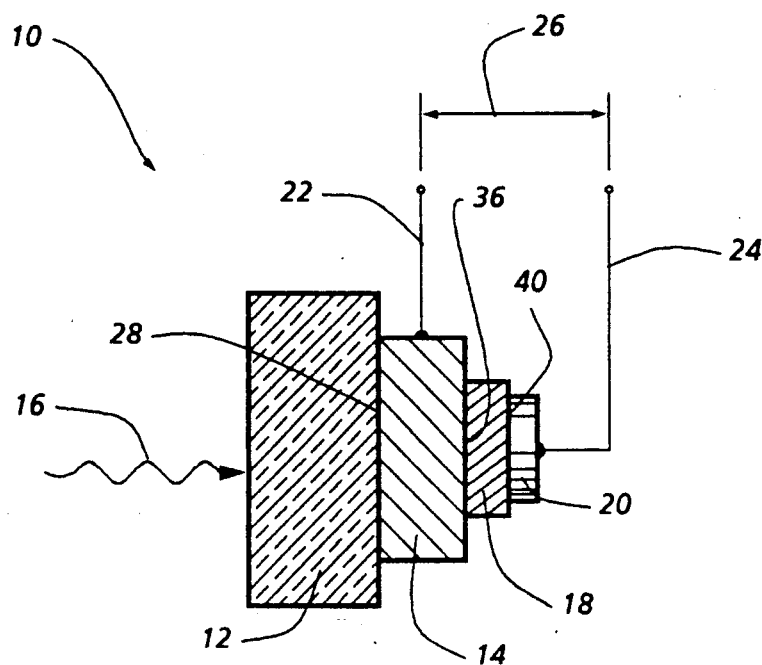
FIG. 1 is a partial side section view through a photovoltaic heterojunction diode type of infrared radiation detector constructed in accordance with one embodiment of the present invention.

Referring now to the drawing in detail, FIG. 1 depicts a heterostructure type of photovoltaic detector, generally referred to by reference numeral 10, having a transparent substrate 12 on which an active infrared radiation absorbing semiconductor layer 14 is deposited. The layer 14 is adapted to be exposed through substrate 12 to infrared radiation 16 within a relatively long wavelength band, such as 8 to 12 $\mu$m. A second relatively thin semiconductor layer 18 is deposited on the layer 14. The layer 18 has a thickness of 0.2 $\mu$m, for example, to establish a current-resistance drop across a junction formed between an overlay 20 and the layer 14 to which electrical leads 22 and 24 may be attached as shown. According to one embodiment, the overlay 20 is made of an appropriate metal forming a Schottky type diode junction with layer 14 across which a signal output voltage 26 appears as sensed through lead lines 22 and 24 for radiation detection purposes as shown. Such output voltage occurs in response to photons of energy in the impinging radiation 16 being detected which is higher than the bandgap of semiconductor layer 14 and results from electron-hole pairs generated under the conditions indicated.

Figure 2:
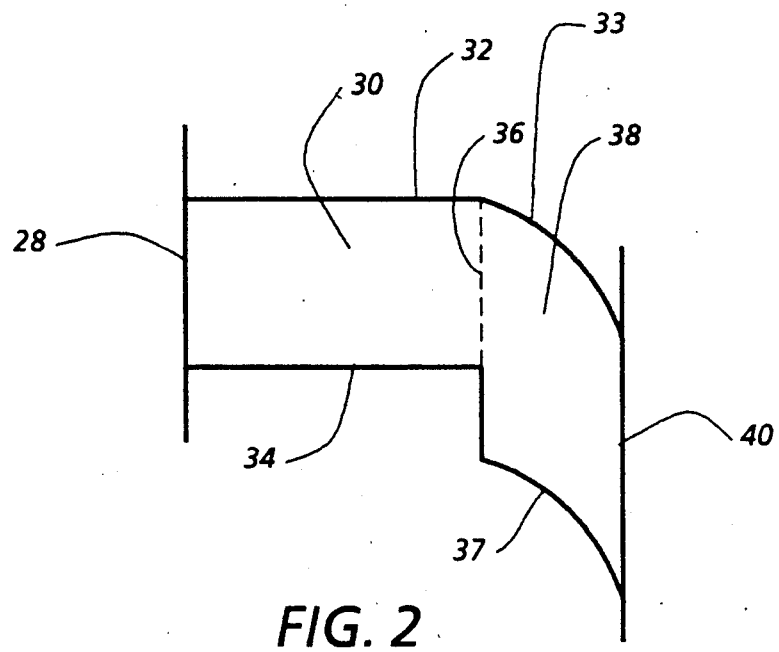
FIG. 2 is an energy band diagram corresponding to the heterojunction structure depicted in FIG. 1.

The interface 28 between the first semiconductor layer 14 and the transparent substrate 12 establishes the limit of a relatively narrow bandgap energy region 30 as diagrammed in FIG. 2 between conduction and valence band edges 32 and 34 establishing the energy bands for the heterojunction structure. Such energy bands are determined by selection of bandgap modifying impurity compounds for the semiconductor materials of layers 14 and 18, including the establishment of a wide bandgap energy region 38 extending from the interface 36 between layers 14 and 18 and the overlay interface 40. The bandgap of region 30 is less than 0.15 eV while the bandgap for region 38 is approximately equal to or higher than 0.40 eV according to one embodiment of the invention.

As a result of the foregoing heterojunction arrangement for photovoltaic detector 10 and the aforementioned selection of semiconductor materials for its layers 14 and 18, mismatch at the heterojunction interface 36 between layers 14 and 18 and band bending of the Schottky junction occurs, as diagrammed in FIG. 2.

Such conditions are associated with the generation of electric fields having the current resistance drop aforementioned separating electrons and holes in connection with otherwise conventional operation of photovoltaic detectors. Also, because of the establishment of a higher diode junction resistance between layer 14 and overlay 20 resulting from the larger bandgap energy of layer 18, the signal output 26 sensed is enhanced while radiation absorption and electrical functions, to which the layers 14 and 18 are respectively limited, are separated.

With respect to the aforementioned selection of semiconductor materials for the layers 14 and 18, certain requirements are imposed on the interrelationships between the operational properties of the semiconductor materials in accordance with the present invention. First, the conduction band edge 33 for layer 18 must be equal to or lower than the conduction band edge 32 of layer 14 according to one embodiment in order to eliminate therein the potential barrier to electron movement toward the Schottky junction during charge transport. Also, the valence band edge 37 of layer 18 should be lower than the valence band edge 34 of layer 14 to or block establish a barrier to hole movement toward the Schottky junction during charge transport. The thickness of the layer 18 as hereinbefore specified is thin enough to substantially avoid optical signal absorption and yet sufficient to accommodate development of band bending as diagrammed in FIG. 2.

In order to meet the requirements and band alignment conditions as hereinbefore specified, the semiconductor materials for layers 14 and 18 may be of the p-type preferably selected from the same class or family of compounds within groups II, IV and VI with Pb, Cd and Sn as cations and S, Se and Te as anions or within groups II and VI with Cd, Zn and Hg as cations and Te and Se as anions. In general, the semiconductor material selections for the layers 14 and 18 should be crystalallographically and chemically compatible.

In an alternative embodiment, the Schottky type metal overlay 20 may be replaced by a n-type overlay to establish a p-n junction through layer 18. According to yet another alternative, the second layer 18 may be provided with a conduction band edge slightly higher than that of layer 14 by no more than approximately 15 meV. In the latter case, thermal excitation should overcome any barrier to electron migration toward the junction formed with overlay 20 without excessive signal degradation under environments above liquid nitrogen temperatures.

The present invention contemplates yet other variations wherein the semiconductor materials for layers 14 and 18 are of the n-type rather than the p-type. In such case, the positions of the layer conduction band edges and valence band edges as hereinbefore described are interchanged.

Still other modifications and variations of the present invention are possible in light of the foregoing teachings. It is therefore to be understood that within the scope of the appended claims the invention may be practiced otherwise than as specifically described.

What is claimed is:

1. A method of detecting radiation by generation of conduction band electrons and valence band holes, comprising the steps of: providing a first semiconducting region having an energy band formed by a conduction band material; providing a second semiconducting region formed by a material establishing a current-resistance drop; generating an electric field extending through said regions with said current-resistance drop; exposing said regions to the radiation being detected to generate said conduction band electrons and the valence band holes; and sensing electrical voltage appearing across said regions as a result of said generation of the conduction band electrons and the valence band holes.

2. The method of claim 1 wherein said materials from which the regions are formed respectively eliminate potential barrier to electron movement and establish a barrier to hole movement.

3. The method of claim 2 wherein said materials are selected bandgap modifying compounds.

4. The method of claim 3 wherein said step of providing the second semiconducting region includes: selection of the bandgap modifying compound thereof to increase resistance while limiting radiation absorption to the first region.

5. The method of claim 1 wherein said step of providing the second semiconducting region includes: selection of the material thereof to increase resistance while limiting radiation absorption to the first region.

6. A method of detecting radiation by generation of conduction band electrons and valence band holes, comprising the steps of: providing a first semiconducting region having an energy band established by a first material eliminating potential barrier to electron movement; providing a second semiconducting region as a heterojunction formed by a second material in a class having properties interrelated with those of the first material while substantially limiting radiation absorption to the first region and increasing resistance; generating an electric field extending through the regions under said increased resistance; exposing said regions to the radiation being detected to generate said conduction band electrons and the valence band holes; and sensing electrical voltage appearing across said regions as a result of said generation of the conduction band electrons and the valence band holes.

7. In a method of detecting incident radiation, the steps of: providing a semiconductor device having layers of semiconducting material; modifying the semiconducting material within the respective layers by different selections of impurity compounds establishing relatively narrow and wide band-gap regions; exposing one of the layers to the incident radiation for absorption thereof within the narrow band-gap region; and disposing another of the layers proximate to said one of the layers to limit detection of the incident radiation by the layers by absorption of photons in a long infrared wavelength spectrum.

8. The method of claim 7 wherein said other of the layers establishes the wide band-gap region within which substantially no absorption of the incident radiation occurs.

9. A method of detecting incident radiation, comprising the steps of: providing a layered semiconductor device having layers of semiconducting material with different amounts of band-gap modifying compounds therein to establish an IR active zone; receiving incident radiation of said layered semiconductor device; absorbing said incident radiation in the layered semiconductor device; generating long wavelength infrared photons as a result of absorbing said incident radiation; and detecting said photons generated in said semiconductor device.

10. The method of claim 9 wherein the step of detecting said photons includes: absorbing said photons in said IR active zone within one of the layers of the device.

* * * * *